United States Patent
Maekawa et al.

(10) Patent No.: US 8,148,878 B2
(45) Date of Patent: Apr. 3, 2012

(54) PIEZOELECTRIC ELEMENT AND GYROSCOPE

(75) Inventors: Kazuya Maekawa, Tokyo (JP); Takao Noguchi, Tokyo (JP); Kenichi Tochi, Tokyo (JP); Ken Unno, Tokyo (JP)

(73) Assignee: TDK Corporation, Tokyo (JP)

( * ) Notice: Subject to any disclaimer, the term of this patent is extended or adjusted under 35 U.S.C. 154(b) by 123 days.

(21) Appl. No.: 12/659,997

(22) Filed: Mar. 26, 2010

(65) Prior Publication Data
US 2010/0244632 A1    Sep. 30, 2010

(30) Foreign Application Priority Data
Mar. 31, 2009   (JP) .................................. 2009-084279

(51) Int. Cl.
*H01L 41/04* (2006.01)

(52) U.S. Cl. ......................... 310/360; 310/357; 310/370

(58) Field of Classification Search .................. 310/357, 310/360, 370
See application file for complete search history.

(56) References Cited

U.S. PATENT DOCUMENTS

| | | | |
|---|---|---|---|
| 2002/0180843 A1* | 12/2002 | Irie et al. | 347/70 |
| 2005/0127795 A1* | 6/2005 | Torii et al. | 310/360 |
| 2007/0257580 A1* | 11/2007 | Chen et al. | 310/328 |
| 2008/0024563 A1 | 1/2008 | Matsui et al. | |
| 2008/0224571 A1* | 9/2008 | Miyazawa et al. | 310/358 |

FOREIGN PATENT DOCUMENTS

JP    A-2008-28285    2/2008

* cited by examiner

*Primary Examiner* — Derek Rosenau
(74) *Attorney, Agent, or Firm* — Oliff & Berridge, PLC

(57) ABSTRACT

A piezoelectric element having a crystal structure that enables a piezoelectric film to be formed in an unstressed state is provided. The piezoelectric film contains an a-axis oriented crystal and a c-axis oriented crystal, where a difference in lattice constant between the a-axis oriented crystal and the c-axis oriented crystal is not more than 0.06 Å. The present inventors have newly found that a stress accumulated in the piezoelectric film can be reduced while maintaining favorable piezoelectric properties when a condition that the difference in lattice constant between the a-axis oriented crystal and the c-axis oriented crystal is not more than 0.06 Å is satisfied. When the condition is satisfied, the c-axis oriented crystal and the a-axis oriented crystal are properly balanced and as a result crystal particles of the piezoelectric film are closest-packed on its base in an ideal state, which contributes to a reduced stress.

7 Claims, 7 Drawing Sheets

FIG. 2

| | d(001)[Å] | I(001)[%] | d(100)[Å] | I(100)[%] | α [%] | $d_{31}$[pm/v] | STRESS [Mpa] | Δd[Å] |
|---|---|---|---|---|---|---|---|---|
| SAMPLE 1 | 4.110 | 55.88 | 4.047 | 5.33 | 9.5 | 75 | 85 | 0.062 |
| SAMPLE 2 | 4.114 | 22.47 | 4.048 | 5.83 | 17.0 | 73 | 90 | 0.066 |
| SAMPLE 3 | 4.123 | 26.47 | 4.036 | 5.35 | 20.2 | 70 | 120 | 0.087 |
| SAMPLE 4 | 4.122 | 24.74 | 4.039 | 6.37 | 25.7 | 72 | 110 | 0.083 |
| SAMPLE 5 | 4.098 | 11.05 | 4.043 | 5.35 | 48.4 | 99.8 | 0.02 | 0.056 |
| SAMPLE 6 | 4.103 | 11.11 | 4.044 | 5.23 | 47.1 | 95.6 | −0.16 | 0.059 |
| SAMPLE 7 | 4.105 | 11.13 | 4.045 | 5.12 | 46.0 | 93.7 | 12.00 | 0.060 |

FIG.5

| | SAMPLE 8 | SAMPLE 9 | SAMPLE 10 | SAMPLE 11 | SAMPLE 12 | SAMPLE 13 |
|---|---|---|---|---|---|---|
| PARTICLE DIAMETER [nm] | 42.97 | 46.88 | 49.81 | 62.50 | 66.41 | 82.03 |
| $d_{31}$ [pm/v] | 95.6 | 99.8 | 93.7 | 94.0 | 93.0 | 79.1 |
| STRESS [Mpa] | −0.16 | 0.02 | 12.00 | 19.83 | 30.22 | 64.47 |
| Pb-ratio | 1.18 | 1.13 | 1.20 | 1.19 | 1.17 | 1.05 |
| FILM FORMATION SPEED [nm/min] | 36.27 | 30.10 | 30.95 | 20.53 | 21.66 | 34.38 |
| RMS [nm] | 0.283 | 0.53 | 0.181 | 0.169 | 0.473 | 0.795 |
| Ra [nm] | 0.113 | 0.281 | 0.086 | 0.119 | 0.136 | 0.49 |
| Rmax [nm] | 0.589 | 1.319 | 0.573 | 0.487 | 0.711 | 2.141 |
| Rz [nm] | 0.427 | 1.298 | 0.343 | 0.487 | 0.454 | 1.207 |

PIEZOELECTRIC ELEMENT AND GYROSCOPE

BACKGROUND OF THE INVENTION

1. Field of the Invention

The present invention relates to a piezoelectric element having an unstressed piezoelectric film, and a gyroscope that uses the piezoelectric element.

2. Description of the Related Art

It is known that properties of a piezoelectric film such as a permittivity, a Curie temperature, a coercive electric field, and a residual polarization vary according to an internal stress of the piezoelectric film. A piezoelectric film formed by a thin film process tends to have a two-dimensional stress that occurs in a film surface during film formation. Accordingly, to obtain a piezoelectric element exhibiting excellent piezoelectric properties, development of a piezoelectric film having a crystal structure with a reduced internal stress is desired. As a piezoelectric element having a crystal structure for reducing an internal stress, for example, Japanese Patent Application Laid-Open No. 2008-28285 proposes a piezoelectric element that has a laminate structure formed by stacking first, second, and third piezoelectric films from one electrode toward another electrode, where a piezoelectric constant of the first and third piezoelectric films is smaller than a piezoelectric constant of the second piezoelectric film. Such a device structure allows for a reduction in internal stress that occurs in an interface between an electrode and a piezoelectric film.

[Patent Document 1] Japanese Patent Application Laid-Open No. 2008-28285

However, in the device structure disclosed in Japanese Patent Application Laid-Open No. 2008-28285, a difference in physical property such as a lattice constant, a thermal expansion coefficient, and the like between the piezoelectric film and its base may cause a compressive stress or a tensile stress to occur in the piezoelectric film during a process of cooling the piezoelectric film after high-temperature film formation. This makes it difficult to achieve a sufficient stress reduction.

SUMMARY OF THE INVENTION

In view of this, the present invention has an object of proposing a piezoelectric element having a crystal structure that enables a piezoelectric film to be formed in an unstressed state. The present invention also has an object of proposing a gyroscope that uses the piezoelectric element having such a crystal structure.

To achieve the stated object, the piezoelectric element according to the present invention includes: a lower electrode; an upper electrode; and a piezoelectric film disposed between the lower electrode and the upper electrode, wherein the piezoelectric film contains an a-axis oriented crystal and a c-axis oriented crystal, and a difference between a lattice constant of the a-axis oriented crystal and a lattice constant of the c-axis oriented crystal is not more than 0.06 Å. As a result of repeating intensive study, the present inventors have newly found that a stress accumulated in the piezoelectric film can be reduced while maintaining favorable piezoelectric properties, when the condition that the difference between the lattice constant of the a-axis oriented crystal and the lattice constant of the c-axis oriented crystal is not more than 0.06 Å is satisfied. Though a mechanism for such an effect is unclear, it is believed that, when the above-mentioned condition is satisfied, the c-axis oriented crystal and the a-axis oriented crystal are properly balanced and as a result crystal particles of the piezoelectric film are closest-packed on its base in an ideal state, which contributes to a reduced stress.

Moreover, it is preferable that the piezoelectric film contains columnar crystal particles that are grown in a c-axis direction, and a particle diameter of the columnar crystal particles is not more than 49.8 nm. When the particle diameter of the columnar crystal particles is not more than 49.8 nm, an influence of a crystal structure of the base on the piezoelectric film is weakened. This makes it easier to control the stress accumulation in the piezoelectric film caused by inconsistency in lattice constant between the piezoelectric film and the base.

A gyroscope according to the present invention includes: a base; and a plurality of arms connected to the base, wherein the base and the plurality of arms are integrally formed by the piezoelectric element having the above-mentioned crystal structure.

According to the present invention, a piezoelectric film after film formation can be controlled in an ideal unstressed state, so that a piezoelectric element having excellent piezoelectric properties can be provided. Moreover, by forming a gyroscope using an unstressed piezoelectric element with no crystal strain or tilting vibration, a gyroscope having excellent detection sensitivity can be provided.

BRIEF DESCRIPTION OF THE DRAWINGS

FIG. 2 is a graph showing measurement results of various parameters obtained when varying each of a lattice constant of an a-axis oriented crystal and a lattice constant of a c-axis oriented crystal in a piezoelectric film.

FIG. 5 is a graph showing measurement results of various parameters obtained when varying a crystal particle diameter of the piezoelectric film.

DESCRIPTION OF THE PREFERRED EMBODIMENTS

The following describes a crystal structure and piezoelectric properties of a piezoelectric element 10 according to an embodiment of the present invention, with reference to drawings.

Figure 1:
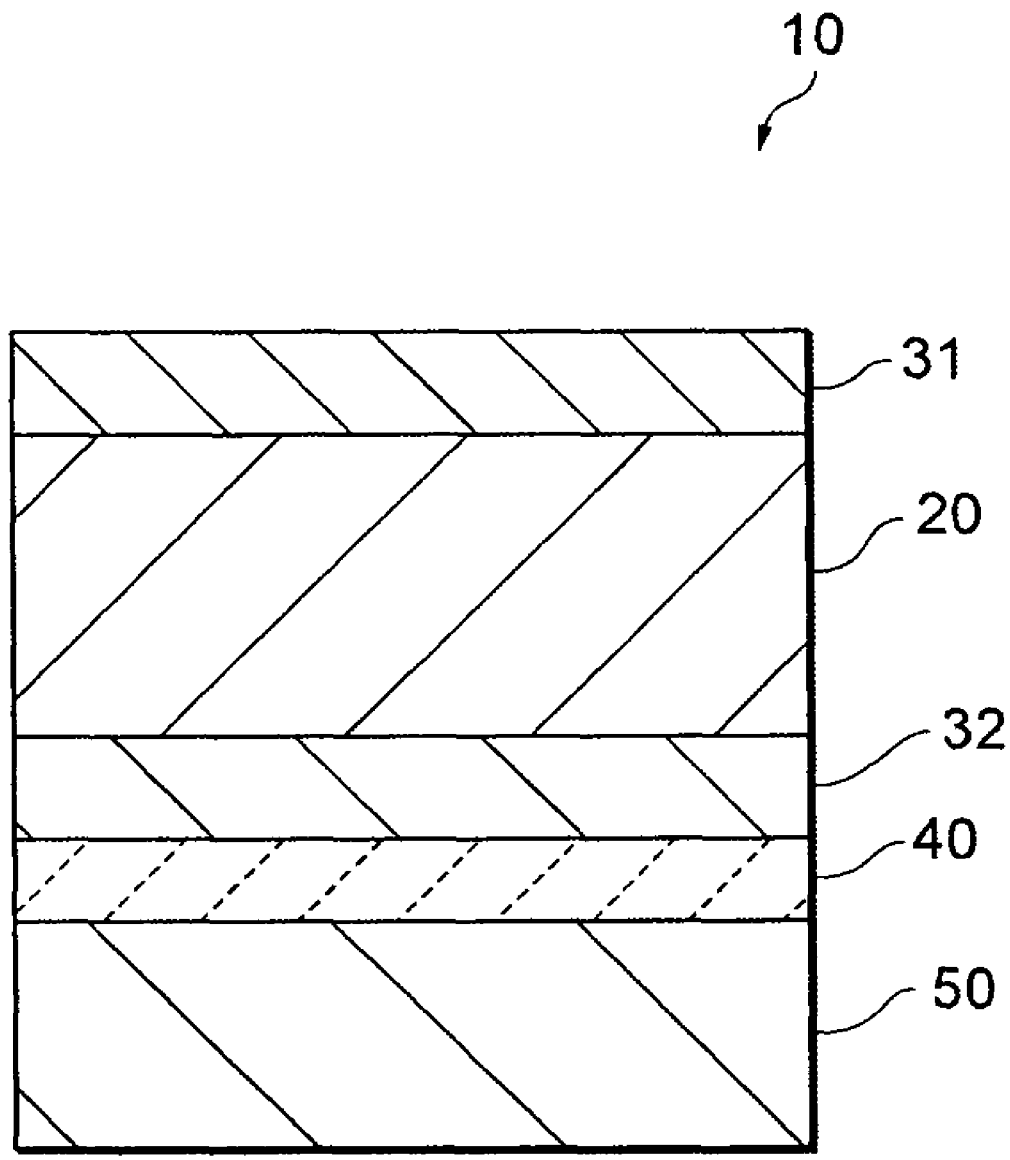
FIG. 1 is a sectional view of a piezoelectric element according to an embodiment of the present invention.

As shown in FIG. 1, the piezoelectric element 10 includes a piezoelectric film 20, and an upper electrode 31 and a lower electrode 32 that are formed respectively on front and back surfaces of the piezoelectric film 20. For example, the piezoelectric film 20 is a perovskite type composite oxide expressed by a chemical formula $ABO_3$. Here, A and B represent cations. A is preferably one or more types selected from Ca, Ba, Sr, Pb, K, Na, Li, La, and Cd, and B is preferably one or more types selected from Ti, Zr, Ta, and Nb. In detail, as a material of the piezoelectric film 20, lead zirconate titanate (PZT), lead magnesium niobate-lead zirconate titanate (PMN-PZT), lead nickel niobate-lead zirconate titanate (PNN-PZT), lead magnesium niobate-lead titanate (PMN-PT), lead nickel niobate-lead titanate (PNN-PT), or the like is suitable.

A material of the upper electrode 31 and the lower electrode 32 is not particularly limited so long as it is a conductive material suited for crystal orientation control and the like of the piezoelectric film 20. For example, platinum (Pt) or the like is suitable. Other examples include gold (Au), copper (Cu), and titanium (Ti). Moreover, these materials may be stacked together in combination.

The piezoelectric element 10 is formed on a growth substrate 50 using a known thin film process. For instance, a silicon single crystal substrate prepared to have a (100) plane as a substrate surface is suitable as the growth substrate 50. As the thin film process for forming the piezoelectric element 10, for example, a vapor phase growth method such as sputtering, plasma CVD, thermal CVD, and MOCVD or a liquid phase growth method such as sol-gel is suitable. An intermediate thin film 40 is desirably interposed between the piezoelectric element 10 and the growth substrate 50. For example, zirconium oxide ($ZrO_2$) is suitable as the intermediate thin film 40. By providing the intermediate thin film 40, the lower electrode 32 formed thereon can be prevented from peeling, and also the piezoelectric film 20 can be epitaxially grown. In this embodiment, $SiO_2$ is formed on a Si substrate, (100) oriented $ZiO_2$ is deposited thereon, and then a (100) oriented Pt lower electrode is formed.

The piezoelectric film 20 is mainly composed of columnar crystal particles that are epitaxially grown in a c-axis direction. Note, however, that a crystal structure of the piezoelectric film 20 is not a perfect (001) single-oriented film, but a thin film in which a c-axis oriented crystal and an a-axis oriented crystal are properly mixed so that crystal particles are closest-packed on the lower electrode 32 in an ideal state.

Figure 3:
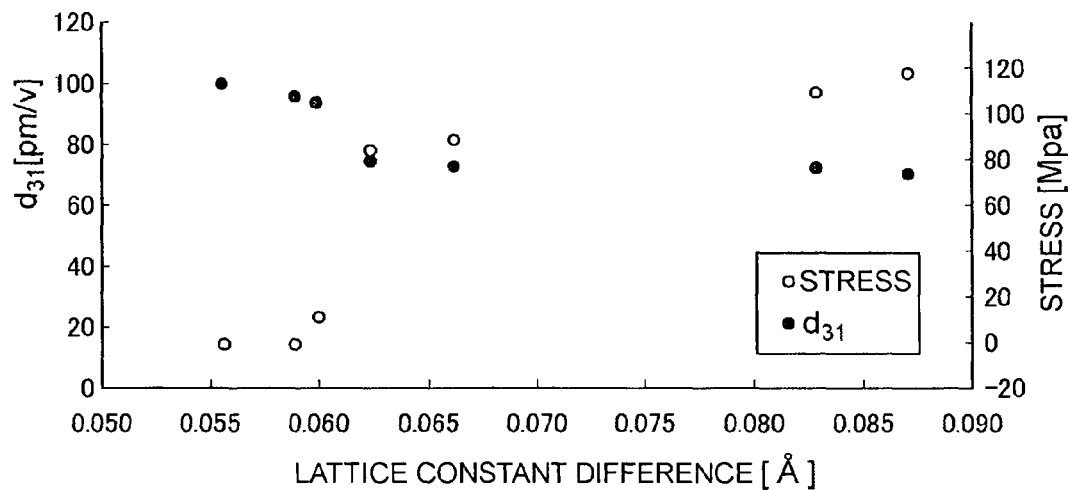
FIG. 3 is a graph showing relations between a difference between the lattice constant of the a-axis oriented crystal and the lattice constant of the c-axis oriented crystal in the piezoelectric film, and each of a piezoelectric constant and a stress.
Figure 4:
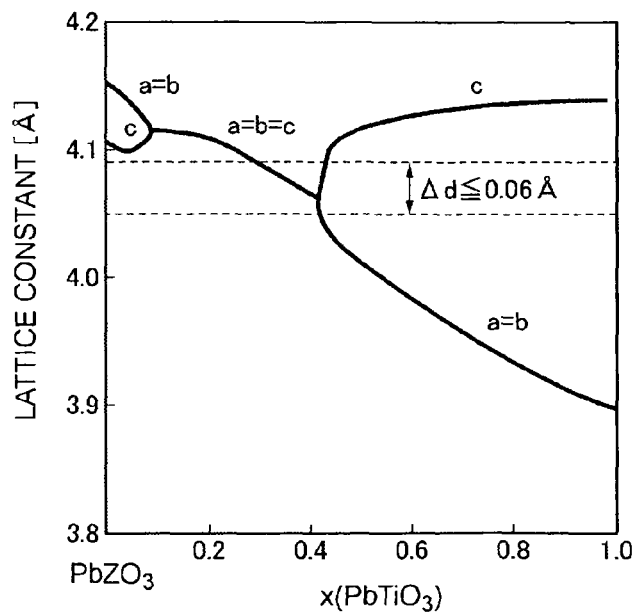
FIG. 4 is a graph showing relations between a composition of the piezoelectric film and a lattice constant.

The crystal structure of the piezoelectric film 20 is preferably adjusted so that a difference between a lattice constant of the a-axis oriented crystal and a lattice constant of the c-axis oriented crystal is not more than 0.06 Å. FIG. 2 shows measurement results of various parameters obtained when varying each of the lattice constant of the a-axis oriented crystal and the lattice constant of the c-axis oriented crystal in a PZT-based thin film formed as the piezoelectric film 20. Here, the lattice constants are calculated from measurement results by X-ray diffraction, according to Bragg's equation. The various parameters are the following:

d(001)=the lattice constant of the c-axis oriented crystal
I(001)=a reflection diffraction intensity of a X-ray diffraction pattern of a (001) plane
d(100)=the lattice constant of the a-axis oriented crystal
I(100)=a reflection diffraction intensity of a X-ray diffraction pattern of a (100) plane
$\alpha = I(100)/I(001)$
$d_{31}$=a piezoelectric constant of the piezoelectric film 20
stress=a stress accumulated in the piezoelectric film 20 when the piezoelectric film 20 after film formation is cooled to a room temperature
$\Delta d$=the difference between the lattice constant of the a-axis oriented crystal and the lattice constant of the c-axis oriented crystal When the lattice constant difference $\Delta d$ is plotted in a horizontal axis and the stress and $d_{31}$ are plotted in a vertical axis based on these measurement results, a graph shown in FIG. 3 is obtained. As can be understood from the graph shown in FIG. 3, the present inventors have newly found that the stress accumulated in the piezoelectric film 20 can be reduced while maintaining the piezoelectric constant $d_{31}$ at a favorable level when a condition that the difference between the lattice constant of the a-axis oriented crystal and the lattice constant of the c-axis oriented crystal is not more than 0.06 Å is satisfied. Though a mechanism for such an effect is unclear, it is believed that, when the above-mentioned condition is satisfied, the c-axis oriented crystal and the a-axis oriented crystal are properly balanced and as a result crystal particles of the piezoelectric film 20 are closest-packed on the lower electrode 32 in an ideal state, which contributes to a reduced stress. When a solid solution ratio of lead titanate and lead zirconate in lead zirconate titanate is plotted in a horizontal axis as a mixture ratio x, a lattice constant is plotted in a vertical axis, and a region where $\Delta d \leqq 0.06$ Å is depicted, a graph shown in FIG. 4 is obtained.

The piezoelectric film 20 contains the columnar crystal particles grown in the c-axis direction, and a particle diameter of the columnar crystal particles is preferably not more than 49.8 nm. FIG. 5 shows measurement results of various parameters obtained when varying a crystal particle diameter of columnar crystal particles in a PZT-based thin film as the piezoelectric film 20 that are epitaxially grown in the c-axis direction by sputtering. Here, the particle diameter and roughness are measured by an AFM (atomic force microscope), and an atom number ratio is calculated based on a composition analysis by XRF (X-ray fluorescence analysis). The particle diameter is a diameter of columnarly grown particles. The various parameters are the following.

particle diameter=the particle diameter of the columnar crystal in the piezoelectric film 20
$d_{31}$=the piezoelectric constant of the piezoelectric film 20
stress=the stress accumulated in the piezoelectric film 20 when the piezoelectric film 20 after film formation is cooled to a room temperature
Pb-ratio=atom number ratio Pb/(Zr+Ti)
film formation speed=a film formation speed of the piezoelectric film 20
RMS=root mean square roughness of the piezoelectric film 20
Ra=arithmetic mean roughness of the piezoelectric film 20
Rmax=maximum roughness of the piezoelectric film 20
Rz=ten-point mean roughness of the piezoelectric film 20

In this embodiment, a PZT (lead zirconate titanate) film is formed as the piezoelectric film 20 by sputtering. Here, the film formation is performed by adjusting a film formation condition of sputtering based on various parameters. For instance, the particle diameter and the like may be controlled by adjusting a process gas pressure, a sputtering applied voltage, an oxygen gas partial pressure, a T-S distance (target-substrate distance), and VDC/VPP.

Figure 6:
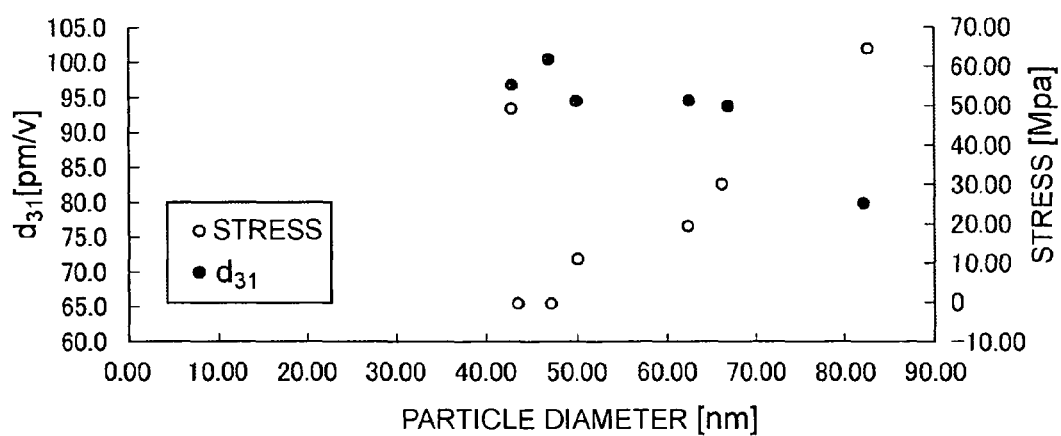
FIG. 6 is a graph showing relations between the particle diameter of the piezoelectric film and each of the piezoelectric constant and the stress.

When the particle diameter is plotted in a horizontal axis and the stress and $d_{31}$ are plotted in a vertical axis based on these measurement results, a graph shown in FIG. 6 is obtained. As can be understood from the graph shown in FIG. 6, the present inventors have newly found that the stress accumulated in the piezoelectric film 20 can be reduced while maintaining the piezoelectric constant $d_{31}$ at a favorable level when a condition that the particle diameter of the columnar crystal particles grown in the c-axis direction is not more than 49.8 nm is satisfied. An epitaxially grown crystal is typically grown under an influence of a crystal structure of its base.

Accordingly, when the particle diameter of the columnar crystal particles is more than 49.8 nm, the influence of the crystal structure of the base is significant and the stress tends to be accumulated in the piezoelectric film 20 due to inconsistency in lattice constant between the piezoelectric film 20 and the base. When the particle diameter of the columnar crystal particles is not more than 49.8 nm, on the other hand, the influence of the crystal structure of the base on the piezoelectric film 20 is weakened, which makes it easier to control the stress accumulation in the piezoelectric film 20 caused by inconsistency in lattice constant between the piezoelectric film 20 and the base.

An experiment conducted by the present inventors demonstrates that the piezoelectric film 20 after film formation can be especially effectively controlled in an unstressed state by adjusting the particle diameter of the columnar crystal particles grown in the c-axis direction to not more than 49.8 nm, in the case where a material of an uppermost film of the intermediate thin film 40 as the base of the piezoelectric film 20 is (100) oriented strontium ruthenate.

Figure 7:
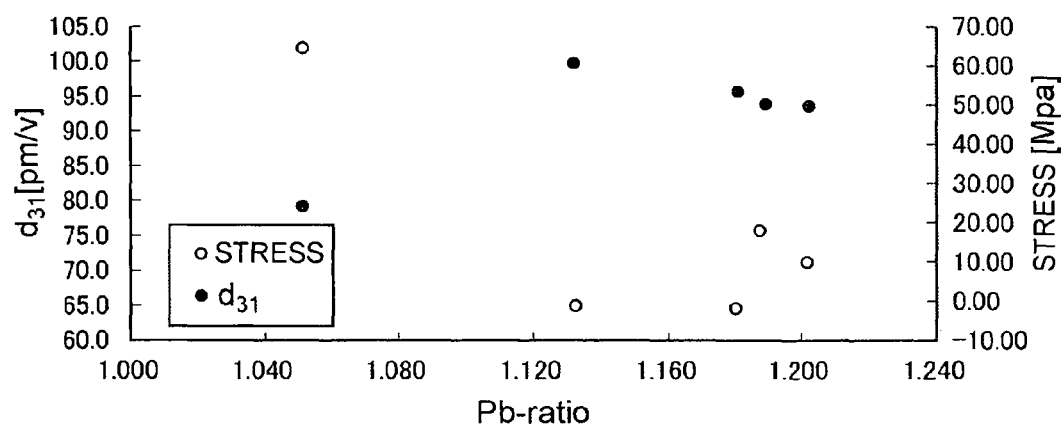
FIG. 7 is a graph showing relations between Pb-ratio of the piezoelectric film and each of the piezoelectric constant and the stress.

When Pb-ratio is plotted in a horizontal axis and the stress and $d_{31}$ are plotted in a vertical axis based on the measurement results shown in FIG. 5, a graph shown in FIG. 7 is obtained. As a result of analyzing the graph shown in FIG. 7, it can be understood that the stress accumulated in the piezoelectric film 20 can, be reduced while maintaining the piezoelectric constant $d_{31}$ at a favorable level when Pb-ratio is in a range of 1.1 to 1.2. This is not limited to Pb-ratio, as an experiment conducted by the present inventors demonstrates that the same effect can be attained when the atom number ratio A/B of the perovskite type composite oxide $ABO_3$ is in a range of 1.1 to 1.2.

Moreover, analyzing the measurement results shown in FIG. 5 in terms of surface roughness indicates that, to reduce the stress accumulated in the piezoelectric film 20 while maintaining the piezoelectric constant $d_{31}$ at a favorable level, the root mean square roughness (RMS) of the piezoelectric film 20 is preferably not more than 0.53 nm, the arithmetic mean roughness (Ra) of the piezoelectric film 20 is preferably not more than 0.28 nm, the maximum roughness (Rmax) of the piezoelectric film 20 is preferably not more than 1.32 nm, and the ten-point mean roughness (Rz) of the piezoelectric film 20 is preferably not more than 1.30 nm.

The crystal particle diameter of the piezoelectric film 20 can be controlled to not more than 49.8 nm in a vapor phase growth method or a liquid phase growth method, by appropriately adjusting film formation conditions. For example, in the case of controlling the crystal particle diameter in sputtering, the film formation conditions include a process gas pressure, a sputtering applied voltage, an oxygen gas partial pressure, a film formation speed, a sputtering target-substrate distance, a sputtering target self bias, and so on. In more detail, the process pressure is preferably in a range of 0.1 Pa to 1.0 Pa, the sputtering target-substrate distance is preferably not more than 150 mm, and the film formation speed is preferably in a range of 3 nm/min to 50 nm/min.

The following describes a structure and operation principle of a gyroscope 100 according to the embodiment of the present invention.

Figure 8:
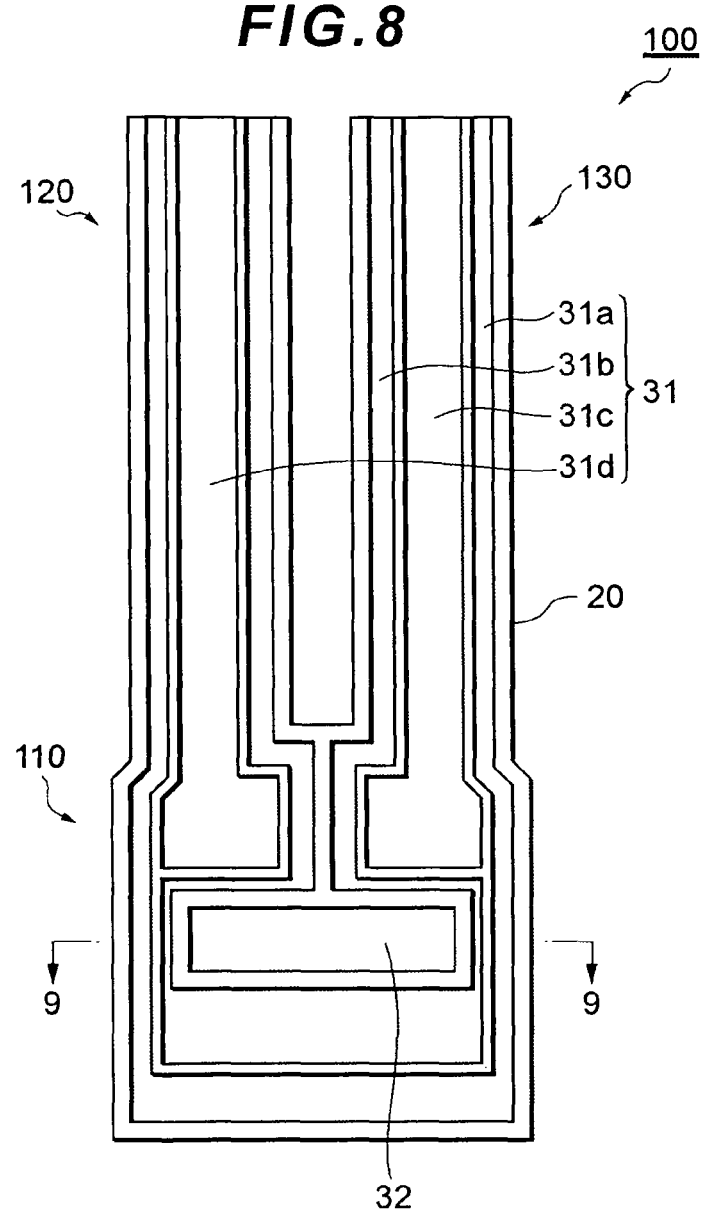
FIG. 8 is a plan view of a gyroscope according to the embodiment of the present invention.
Figure 9:
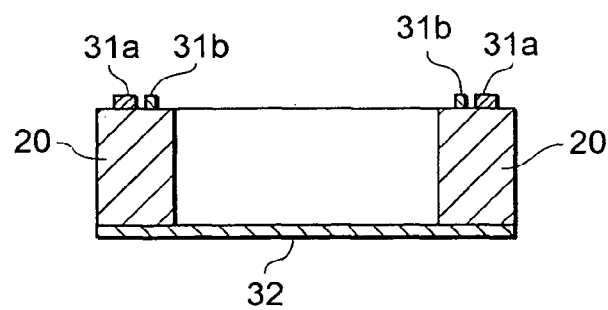
FIG. 9 is a sectional view taken along the line 9-9 in FIG. 8.

FIG. 8 is a plan view of the gyroscope 100, and FIG. 9 is a sectional view taken long the line 9-9 in FIG. 8. The gyroscope 100 is an angular velocity detector of a tuning fork vibrator type that includes a base 110 and two arms 120 and 130 connected to one surface of the base 110. The gyroscope 100 is obtained by microfabricating the piezoelectric film 20, the upper electrode 31, and the lower electrode 32 included in the above-mentioned piezoelectric element 10 in accordance with a tuning fork vibrator shape, where the parts (the base 110 and the arms 120 and 130) are integrally formed by the piezoelectric element 10. Driving electrodes 31a and 31b and a detection electrode 31d are formed on a first main surface of the arm 120. Likewise, the driving electrodes 31a and 31b and a detection electrode 31c are formed on a first main surface of the other arm 130. These electrodes 31a, 31b, 31c, and 31d are each obtained by etching the upper electrode 31 in a predetermined electrode shape. Meanwhile, the lower electrode 32 formed all over a second main surface (a main surface opposite to the first main surface) of each of the arms 120 and 130 and the base 110 functions as a ground electrode of the gyroscope 100.

Figure 10:
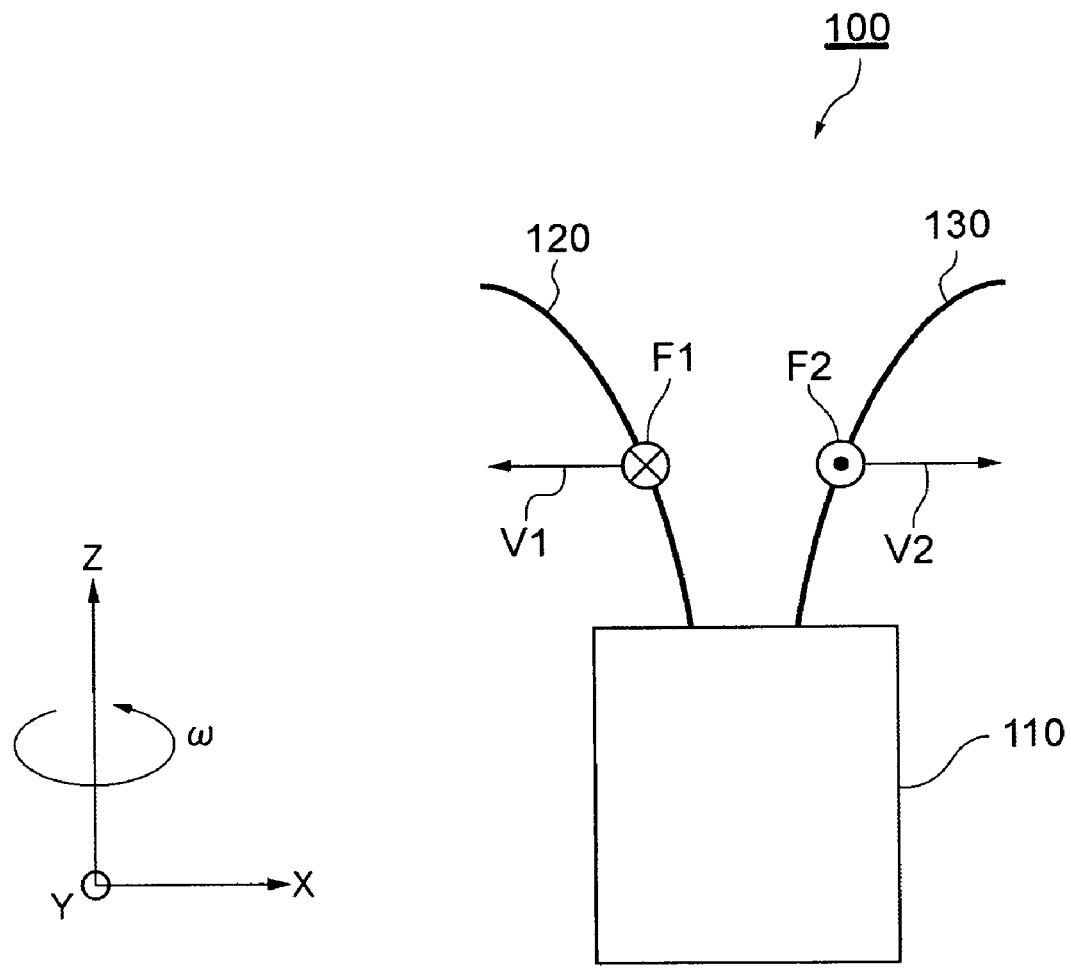
FIG. 10 is a schematic view for describing a driving principle of the gyroscope according to the embodiment.

As shown in FIG. 10, an XYZ orthogonal coordinate system is defined where a longitudinal direction of each of the arms 120 and 130 is a Z direction and a plane including the main surfaces of the two arms 120 and 130 is an XZ plane. When a driving signal is supplied to the driving electrode 31a and 31b, the two arms 120 and 130 are excited in an in-plane vibration mode. The in-plane vibration mode is a vibration mode in which the two arms 120 and 130 are excited in a direction parallel to the main surfaces of the two arms 120 and 130. For example, when the arm 120 is excited at a velocity V1 in a −X direction, the other arm 130 is excited at a velocity V2 in a +X direction. When rotation of an angular velocity w whose axis of rotation is the Z axis is applied to the gyroscope 100 in this state, a Coriolis force acts upon each of the two arms 120 and 130 in a direction orthogonal to the velocity direction, as a result of which the two arms 120 and 130 start to be excited in an out-of-plane vibration mode. The out-of-plane vibration mode is a vibration mode in which the two arms 120 and 130 are excited in a direction orthogonal to the main surfaces of the two arms 120 and 130. For example, when a Coriolis force F1 acting upon the arm 120 is in a −Y direction, a Coriolis force F2 acting upon the other arm 130 is in a +Y direction. Since the Coriolis forces F1 and F2 are proportional to the angular velocity ω, the angular velocity ω can be detected by converting mechanical strains of the arms 120 and 130 caused by the Coriolis forces F1 and F2 to electrical signals (detection signals) by the piezoelectric film 20 and extracting the signals from the detection electrodes 31c and 31d.

By forming the gyroscope 100 using the unstressed piezoelectric element 10 with no crystal strain or tilting vibration, the gyroscope 100 having excellent detection sensitivity can be provided. Though the in-plane vibration mode is a driving vibration mode and the out-of-plane vibration mode is a detection vibration mode in the above description, this may be modified so that the out-of-plane vibration mode is the driving vibration mode and the in-plane vibration mode is the detection vibration mode. Moreover, the total number of arms 120 and 130 is not limited to two, and may be three or more.

INDUSTRIAL APPLICABILITY

The piezoelectric element according to the present invention can be applied to all kinds of electronic devices such as a gyroscope, an actuator, a frequency filter, a nonvolatile memory, a light modulator, and a sounding device.

The present application is based on Japanese priority applications No. 2009-84279 filed on Mar. 31, 2009, the entire content of which is hereby incorporated by reference.

What is claimed is:
1. A piezoelectric element comprising:
a lower electrode;
an upper electrode; and a piezoelectric film disposed between the lower electrode and the upper electrode, wherein the piezoelectric film contains an a-axis oriented crystal and a c-axis oriented crystal, and a difference between a lattice constant of the a-axis oriented crystal and a lattice constant of the c-axis oriented crystal is between 0.056 Å and 0.06 Å.

2. The piezoelectric element according to claim 1, wherein the piezoelectric film contains columnar crystal particles that are grown in a c-axis direction, and a particle diameter of the columnar crystal particles is not more than 49.8 nm.

3. The piezoelectric element according to claim 1, wherein the piezoelectric film is a perovskite type composite oxide expressed by a chemical formula $ABO_3$, and an atomic ratio A/B is in a range of 1.1 to 1.2.

4. The piezoelectric element according to claim 1, wherein arithmetic mean roughness Ra of the piezoelectric film is not more than 0.28 nm.

5. The piezoelectric element according to claim 1, further comprising a layer made of strontium ruthenate between the piezoelectric film and at least one of the lower electrode and the upper electrode.

6. The piezoelectric element according to claim 2, wherein the columnar crystal particles are epitaxially grown in the c-axis direction.

7. A gyroscope of a tuning fork vibrator type, comprising:

a base; and a plurality of arms connected to the base, wherein the base and the plurality of arms are integrally formed by the piezoelectric element according to claim 1.

* * * * *